United States Patent
Ninomiya et al.

(10) Patent No.: US 7,767,548 B2
(45) Date of Patent: Aug. 3, 2010

(54) METHOD FOR MANUFACTURING SEMICONDUCTOR WAFER INCLUDING A STRAINED SILICON LAYER

(75) Inventors: Masaharu Ninomiya, Tokyo (JP); Koji Matsumoto, Tokyo (JP); Masahiko Nakamae, Tokyo (JP); Masanobu Miyao, Fukuoka (JP); Taizoh Sadoh, Fukuoka (JP)

(73) Assignees: Sumco Corporation, Tokyo (JP); Kyushu University, National University Corporation, Fukuoka (JP)

( * ) Notice: Subject to any disclaimer, the term of this patent is extended or adjusted under 35 U.S.C. 154(b) by 293 days.

(21) Appl. No.: 11/840,615

(22) Filed: Aug. 17, 2007

(65) Prior Publication Data
US 2009/0047526 A1      Feb. 19, 2009

(51) Int. Cl.
*H01L 21/30* (2006.01)
(52) U.S. Cl. .............................. 438/459; 257/E21.122
(58) Field of Classification Search ................ 438/459; 257/E21.122
See application file for complete search history.

(56) References Cited
FOREIGN PATENT DOCUMENTS

JP          09-180999       7/1997
JP          11-233440       8/1999

OTHER PUBLICATIONS

English Abstract of Japanese Patent Publication No. JPH 09-180999, published Jul. 11, 1997.
English Abstract of Japanese Patent Publication No. JPH 11-233440, published Aug. 27, 1999.

*Primary Examiner*—W. David Coleman
*Assistant Examiner*—Sonya D McCall-Shepard
(74) *Attorney, Agent, or Firm*—Greenblum & Bernstein, P.L.C.

(57) ABSTRACT

A method for manufacturing a semiconductor wafer with a strained Si layer having sufficient tensile strain and few crystal defects, while achieving a relatively simple layered structure, is provided. The method includes the steps of: (a) forming an SiGe mixed crystal layer 12 and a first Si layer 13 in this order on the surface of a silicon wafer 11; (b) forming an $SiO_2$ layer 16 on top of the first Si layer and/or a support wafer 14; (c) forming a layered product 17 by stacking the silicon wafer and the support wafer with the $SiO_2$ layer being placed therebetween; (d) forming a second Si layer 18 by thinning the silicon wafer of the layered product; (e) implanting hydrogen ion and/or rare gas ion, such that ionic concentration peaks in a predetermined area; (f) subjecting the layered product to a first heat treatment; and (g) carrying out a second heat treatment following the first heat treatment, thereby relaxing the SiGe mixed crystal layer and diffusing Ge through portions of the first Si layer and the second Si layer.

20 Claims, 2 Drawing Sheets

US 7,767,548 B2

METHOD FOR MANUFACTURING SEMICONDUCTOR WAFER INCLUDING A STRAINED SILICON LAYER

BACKGROUND OF THE INVENTION

1. Field of the Invention

The present invention relates to a method for manufacturing a semiconductor wafer having formed on its surface a strained Si layer with internal two-dimensional tensile strain.

2. Description of the Related Art

As used herein, Patent Document 1 refers to

Japanese Laid-Open Patent Publication No. 9-180999 (claim 2 and paragraphs [0020], [0021] and [0031]) and Patent Document 2

Japanese Laid-Open Patent Publication No. 11-233440 (claim 2 and paragraph [0006])

Reportedly, in order to enhance the performance of semiconductor devices employing a silicon single crystal, it is effective to increase the mobility of electrons or holes in the silicon single crystal. Specifically, the mobility of carriers is enhanced by employing a strained Si layer with internal two-dimensional tensile strain as a silicon layer where the electrons or holes flow, and therefore, based on this technique, for example, C-MOS devices capable of operating at high speed have been studied. A semiconductor wafer with a strained Si layer is manufactured by forming a relaxed SiGe layer, which has a larger lattice constant than Si, on an Si wafer through epitaxy, and forming the strained Si layer through epitaxial growth of a thin Si layer on the relaxed SiGe layer. Since the SiGe layer formed on the Si wafer has a Ge concentration of up to 30%, crystal defects such as misfit dislocation occur due to the difference in lattice constant between the Si substrate and the SiGe layer, adversely affecting the strained Si layer formed on the SiGe layer. The density of crystal defects caused by conventional manufacturing methods is in the range of approximately $1 \times 10^5$ to $1 \times 10^7$ defects/cm$^2$. To solve this problem, some methods have been proposed, including a method employing a buffer layer with a composition ratio of Ge in SiGe being increased at a constant gentle gradient, a method employing a buffer layer with a stepwise changing Ge composition ratio, a method employing a buffer layer with a Ge composition ratio changing in a superlattice pattern, and a method employing a buffer layer with a Ge composition ratio being changed at a constant gradient by using an Si offcut wafer.

One of such methods proposed for manufacturing a semiconductor wafer with a strained Si layer while suppressing crystal defects is a semiconductor device manufacturing method including the steps of: preparing a substrate composed of an Si-oxide layer and a first Si layer, which are provided in order on an Si support, and forming a dislocation conversion layer (Ge layer) on the first Si layer through epitaxy, in which the dislocation conversion layer, when in an unstrained state, has a lattice constant different from that of unstrained Si and that of SiGe having the same composition as an SiGe layer to be grown next; forming the SiGe layer on the dislocation conversion layer through epitaxy; lattice-relaxing the SiGe layer through heat treatment; and forming a second Si layer in a strained state on the SiGe layer through epitaxy (for example, refer to Patent Document 1). According to this Patent Document 1, by employing the dislocation conversion layer such as the Ge layer, local strain is induced at and parallel to the interface between the first Si layer and the dislocation conversion layer through heat treatment, for example, at 800° C. for one hour, and when the SiGe layer is lattice-relaxed by the heat treatment, the local strain causes threading dislocation occurring in the first Si layer to be converted into glide dislocation at the interface, so that the threading dislocation does not reach the SiGe layer. Thus, according to the above publication, it is possible to obtain a semiconductor device with an SOI substrate having a high-quality strained Si layer and a thin SiGe layer underlying the Si layer. In addition, there have been disclosed semiconductor devices including: a crystal substrate; an insulating crystal thin film formed on the crystal substrate; a first crystal thin film formed on and highly lattice-matched to the insulating crystal thin film; and a second crystal thin film formed on the first crystal thin film, having a lattice constant different from that of the first crystal thin film and a thickness less than a critical thickness to induce lattice relaxation (for example, refer to Patent document 2). According to this Patent Document 2, by employing calcium fluoride and γ-alumina as materials for the insulating crystal thin film, it becomes possible to introduce sufficient strain to a semiconductor crystal thin film formed in a thickness of 100 nm or less on the insulating crystal thin film.

In both the techniques disclosed in Patent Documents 1 and 2, the strained Si layer is formed by epitaxially growing the Si layer on the SiGe layer having a larger lattice constant than Si, thereby solving two problems of inducing strain in the Si layer using a sufficiently lattice-relaxed SiGe layer, and preventing dislocation from occurring in the SiGe layer in order not to propagate the dislocation during the growth of the strained Si layer.

However, the manufacturing method disclosed in Patent Document 1 has a disadvantage in that if the heat treatment for lattice relaxation is carried out at 800° C., glide dislocation required for sufficiently relaxing the SiGe layer does not occur at the interface, resulting in unsuccessful lattice relaxation, hence insufficient strain. Note that if the heat treatment is carried out at 1000° C. or higher, the Ge layer is caused to melt, so that surface roughness progresses and crystal defects are induced. In addition, the semiconductor device disclosed in Patent Document 2 uses a specialized layer such as calcium fluoride, making it difficult to apply a conventional semiconductor manufacturing process, resulting in a high manufacturing cost, and further resulting in a lack of versatility, e.g., it is difficult to thin the device to 100 nm or less. Furthermore, the semiconductor devices with the strained Si layer as disclosed in patent documents 1 and 2 require at least two thin film growth processes, and are composed of a complicated multi-layered structure, which requires a number of processes, and therefore it is not always possible to manufacture a high-quality semiconductor wafer nor to manufacture it in a simplified manner.

SUMMARY OF THE INVENTION

An objective of the present invention is to provide a method for manufacturing a semiconductor wafer having a relatively simple layered structure in which a strained Si layer with sufficient tensile strain and few crystal defects is formed.

A first aspect of the present invention is directed to a method for manufacturing a semiconductor wafer, including the steps of, as shown in FIG. 1: (a) forming an SiGe mixed crystal layer 12 and a first Si layer 13 in this order on a surface of a silicon wafer 11; (b) forming an SiO$_2$ layer 16 on top of the first Si layer 13 and/or a support wafer 14, the support wafer 14 being prepared separately from the silicon wafer 11; (c) forming a layered product 17 by stacking the silicon wafer 11 and the support wafer 14 with the SiO$_2$ layer 16 being placed therebetween; (d) forming a second Si layer 18 by thinning the silicon wafer 11 of the layered product 17 to a predetermined thickness; (e) implanting hydrogen ion and/or rare gas ion, such that ionic concentration peaks in an area including both an interface between the first Si layer 13 and the SiO$_2$ layer 16, and the first Si layer 13 in a vicinity of the interface; (f) carrying out a first heat treatment by maintaining the layered product 17 in an inert gas atmosphere containing nitrogen or Ar gas at 450 to 600° C. for 15 to 600 minutes; and (g) carrying out a second heat treatment following the first heat treatment, at 800 to 1000° C. for 15 to 300 minutes, thereby relaxing the SiGe mixed crystal layer 12 and diffusing Ge through portions of the first Si layer 13 and second Si layer 18.

According to the first aspect, by carrying out the steps (a) to (g), it is possible to manufacture a semiconductor wafer with a strained Si layer having sufficient tensile strain and few crystal defects within the range of approximately $1 \times 10^2$ to $1 \times 10^3$ defects/cm$^2$, while achieving a relatively simple layered structure.

In a second aspect of the present invention, based on the first aspect, the method further includes the step of (h) carrying out a third heat treatment following the second heat treatment, in an oxidizing atmosphere at 1100 to 1300° C. for 1 to 600 minutes.

According to the second aspect, by carrying out the third heat treatment, the second Si layer 18 is thinned or changed into an oxidized film, thereby making it possible to increase the concentration of Ge diffused in step (g).

A third aspect of the present invention is directed to a method for manufacturing a semiconductor wafer, including the steps of, as shown in FIG. 2: (A) forming an SiGe mixed crystal layer 22 and a first Si layer 23 in this order on a surface of a silicon wafer 21; (B) forming an SiO$_2$ layer 26 on top of the first Si layer 23 and/or a support wafer 24, the support wafer 24 being prepared separately from the silicon wafer 21; (C) forming a damaged layer 21a at an ion implantation position within the silicon wafer 21 by implanting hydrogen or rare gas ions, such that ionic concentration peaks at 0.3 to 1.0 μm below a surface of the first Si layer 23 within the silicon wafer 21; (D) forming a layered product 27 by stacking the silicon wafer 21 and the support wafer 24 with the SiO$_2$ layer 26 being placed therebetween; (E) forming a second Si layer 28 by separating the silicon wafer 21 at a position of the damaged layer 21a; (F) implanting hydrogen ion and/or rare gas ion, such that ionic concentration peaks in an area including both an interface between the first Si layer 23 and the SiO$_2$ layer 26, and the first Si layer 23 in a vicinity of the interface; (G) subjecting the layered product 27 to a first heat treatment in an inert gas atmosphere containing nitrogen or Ar gas at 450 to 600° C. for 15 to 600 minutes; and (H) carrying out a second heat treatment following the first heat treatment, at 800 to 1000° C. for 15 to 300 minutes, thereby relaxing the SiGe mixed crystal layer 22 and diffusing Ge through portions of the first Si layer 23 and second Si layer 28.

According to the third aspect, by carrying out the steps (A) to (H), it is possible to manufacture a semiconductor wafer with a strained Si layer having sufficient tensile strain and few crystal defects within the range of approximately $1 \times 10^2$ to $1 \times 10^3$ defects/cm$^2$, while achieving a relatively simple layered structure.

In a fourth aspect of the present invention, based on the third aspect, the method further includes the step of (I) carrying out a third heat treatment following the second heat treatment, in an oxidizing atmosphere at 1100 to 1300° C. for 1 to 600 minutes.

According to the fourth aspect, by carrying out the third heat treatment, the second Si layer 28 is thinned or changed into an oxidized film, thereby making it possible to increase the concentration of Ge diffused in step (H).

The methods for manufacturing a semiconductor wafer according to the present invention are advantageously capable of manufacturing a semiconductor wafer with a strained Si layer having sufficient tensile strain and few crystal defects within the range of approximately $1 \times 10^2$ to $1 \times 10^3$ defects/cm$^2$, while achieving a relatively simple layered structure.

DETAILED DESCRIPTION OF THE PREFERRED EMBODIMENTS

Next, the first embodiment of the present invention will be described with reference to FIG. 1.

Figure 1:
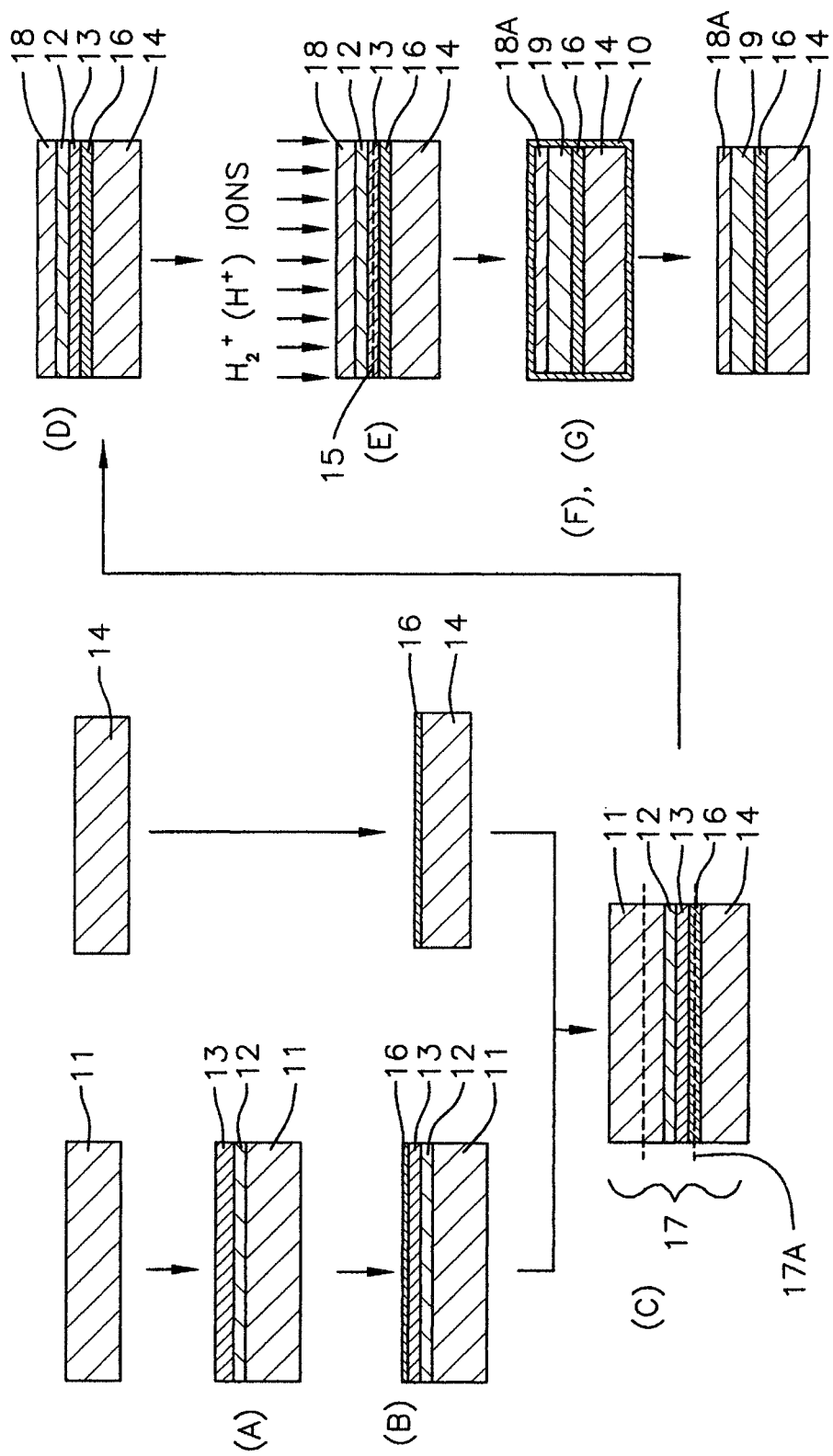
FIG. 1 is a process chart illustrating a method for manufacturing a semiconductor wafer according to a first embodiment of the present invention.

First, as shown in FIG. 1, a silicon wafer 11 and a support wafer 14 are prepared. The silicon wafer 11 is not restrictive, and any silicon wafer can be used so long as it is composed of a single crystal silicon and manufactured by a Czochralski method (hereinafter, referred to as the "CZ method") or a floating-zone method (hereinafter, referred to as the "FZ method"). In order to enhance the quality of a strained Si layer used for forming a device, a layer with few crystal defects is preferably used at least in the vicinity of the wafer surface. Specifically, preferred examples of the wafer include: a wafer in which a denuded zone (DZ) layer is formed in the vicinity of the wafer surface through heat treatment; a wafer in which so-called "grown-in" defects in a single crystal are reduced or eliminated by controlling growth conditions of the CZ method; and an FZ wafer. In addition, the single crystal silicon as described in conjunction with the silicon wafer 11 can be used for the support wafer 14, but if such a single crystal silicon is not used, by employing instead a highly resistive wafer having a resistivity of 1000 Ωcm or more, it becomes possible to manufacture a mobile communication semiconductor wafer with an outstanding high-frequency characteristic. Also, the support wafer 14 may be an insulating substrate such as a quartz substrate, a sapphire substrate, an SiC substrate, and an aluminum nitride substrate.

Next, an SiGe mixed crystal layer 12 and a first Si layer 13 are formed in this order on the surface of the silicon wafer 11 (step (a)). The SiGe mixed crystal layer 12 and the first Si layer 13 are preferably formed by, for example, a molecular beam epitaxy (MBE) device or an ultra-high vacuum chemical vapor deposition (UHV-CVD) device. The Ge composition of the SiGe mixed crystal layer 12 to be formed is preferably 3 to 30%, particularly preferably 5 to 25%. When the Ge composition of the SiGe mixed crystal layer 12 is less than 3%, the Ge concentration is diluted through diffusion, so that the strained Si layer formed does not have sufficient tensile strain. On the other hand, when the Ge composition exceeds 30%, the difference in lattice constant between the first Si layer 13 and the SiGe mixed crystal layer 12 makes the SiGe mixed crystal layer 12 susceptible to misfit dislocation, which is increased by a subsequent heat treatment step, adversely affecting the crystallinity of the final strained Si layer. The SiGe mixed crystal layer 12 is formed to a thickness of preferably 20 nm to 1 μm, particularly preferably 50 to 500 nm.

When the thickness is less than 20 nm, the strained Si layer formed does not have sufficient tensile strain. On the other hand, when the thickness exceeds 1 μm, the device property of the strained Si layer deteriorates, for example, due to an increase of a parasitic capacitance. The first Si layer 13 is formed to a thickness of preferably 5 to 50 nm, particularly preferably 10 to 30 nm.

Next, an $SiO_2$ layer 16 is formed on top of the first Si layer 13 and/or the support wafer 14 (step (b)). The $SiO_2$ layer 16 may be formed by a conventional thermal oxidation method or by depositing $SiO_2$ on top of the first Si layer 13 and/or the support wafer 14, through a CVD method. The $SiO_2$ layer 16 is formed to a thickness of preferably 50 to 1000 nm, particularly preferably 100 to 250 nm.

Next, the silicon wafer 11 and the support wafer 14 are stacked with the $SiO_2$ layer 16 being placed therebetween to form a layered product 17 (step (c)). In step (c), the silicon wafer 11 and the support wafer 14 are stacked with the $SiO_2$ layer 16 being placed therebetween at room temperature and thereby bonded together.

Next, the silicon wafer 11 of the layered product 17 is thinned to form a second Si layer 18 (step (d)). By that thinning, the second Si layer 18 is formed to a thickness of preferably 30 to 300 nm, particularly preferably 50 to 150 nm. A problem arises where the strained Si layer becomes excessively thin or thick when the thickness of the second Si layer 18 is less than 30 nm or more than 300 nm, making the semiconductor wafer susceptible to defects and deterioration of quality. Examples of the methods for thinning the silicon wafer 11 include grinding, polishing, wet etching through an acid or alkali aqueous solution, vapor-phase etching through plasma, and lapping. Heat treatment is preferably carried out to enhance the bonding strength of the layered product 17. The heat treatment is carried out, for example, by maintaining the layered product 17 in an argon gas atmosphere at 1100° C. for 120 minutes, to enhance the bonding strength at a bonding position 17a.

Next, hydrogen ion and/or rare gas ion are/is implanted such that ionic concentration peaks in an area 15 including both the interface between the first Si layer 13 and the $SiO_2$ layer 16, and the first Si layer 13 in a vicinity of the interface (step (e)). As a result of the ion implantation to the area 15, hydrogen or rare gas ions implanted by first and second heat treatments carried out in subsequent steps reduce the binding power between the first Si layer 13 and the $SiO_2$ layer 16 during the heat treatments, allowing the SiGe mixed crystal layer 12 to be readily strain-relaxed. Consequently, the second Si layer 18 remaining in a predetermined thickness is lattice-matched to a strain-relaxed SiGe diffusion layer 19 to form a strained Si layer 18a. The term "the first Si layer 13 in a vicinity of the interface" may refer the first Si layer 13 from the interface up to half thickness of the layer 13, preferably one-fourth thickness of the layer 13. Examples of the rare gas to be implanted include helium and neon. It is particularly preferable to implant hydrogen ions. In the case of implanting hydrogen ions, the ions are implanted preferably at a dose of 3 to $50 \times 10^{15}$ atoms/cm², particularly preferably at a dose of $10 \times 10^{15}$ atoms/cm². Ge in the SiGe mixed crystal layer 12 is not allowed to be readily mobile when the implantation dose is less than $3 \times 10^{15}$ atoms/cm², while the effect does not vary even when the implantation dose exceeds $50 \times 10^5$ atoms/cm².

Next, the first heat treatment is carried out by maintaining the layered product 17 in an inert gas atmosphere containing nitrogen or Ar gas at 450 to 600° C. for 15 to 600 minutes (step (f)). In the first heat treatment, the layered product 17 is maintained particularly preferably at 500° C. for 30 minutes. Furthermore, following the first heat treatment, the second heat treatment is carried out by maintaining the layered product 17 at 800 to 1000° C. for 15 to 300 minutes, thereby relaxing the SiGe mixed crystal layer 12 as well as diffusing Ge through portions of the first Si layer 13 and second Si layer 18 (step (g)). In the second heat treatment, the layered product 17 is maintained particularly preferably at 850° C. for 120 minutes. By carrying out the first and second heat treatments, the SiGe mixed crystal layer 12 is relaxed, and Ge is diffused through the portions of the first Si layer 13 and second Si layer 18, thereby forming the SiGe diffusion layer 19. The second Si layer 18 is tensed to accord with the lattice constant of the SiGe diffusion layer 19 and thereby induce strain to become the strained Si layer 18a.

In addition, after the second heat treatment, a third heat treatment may be carried out to maintain the layered product 17 in an oxidizing atmosphere at 1100 to 1300° C. for 1 to 600 minutes (step (h)). The third heat treatment thins the second Si layer 18 transformed into the strained Si layer 18a, or changes the second Si layer 18 transformed into the strained Si layer 18a into an oxidized film, thereby making it possible to increase the concentration of Ge in the SiGe diffusion layer 19 that has been diffused in step (g). Note that at the time of completion of the second heat treatment in step (g), if the strained Si layer 18a has a thickness required for the strained Si layer, and the SiGe diffusion layer 19 retains a requisite Ge concentration, the third heat treatment can be omitted. Lastly, an oxidized film 20 formed on the surfaces of the layered product 17 is removed to expose the surfaces, thereby obtaining a semiconductor wafer having the strained Si layer. Depending on the Ge concentration of the SiGe diffusion layer 19, the thickness of the strained Si layer 18a is preferably 5 to 30 nm.

While the first and second heat treatment steps are performed so as to form the strained Si layer 18a from the second Si layer 18, these steps may be carried out so as not to form the strained Si layer by oxidizing the surface of the second Si layer 18 and diffusing Ge in the SiGe mixed crystal layer 12. In such a case, the oxidized film 20 is removed after the heat treatment steps, and Si is deposited on the exposed SiGe diffusion layer 19 through epitaxy, thereby obtaining a semiconductor wafer with the strained Si layer 18a. As such, by carrying out steps (a) to (g), it is possible to manufacture a semiconductor wafer with a strained Si layer having sufficient tensile strain and few crystal defects within the range of approximately $1 \times 10^2$ to $1 \times 10^3$ defects/cm², while achieving a relatively simple layered structure.

Next, the second embodiment of the present invention will be described with reference to FIG. 2.

Figure 2:
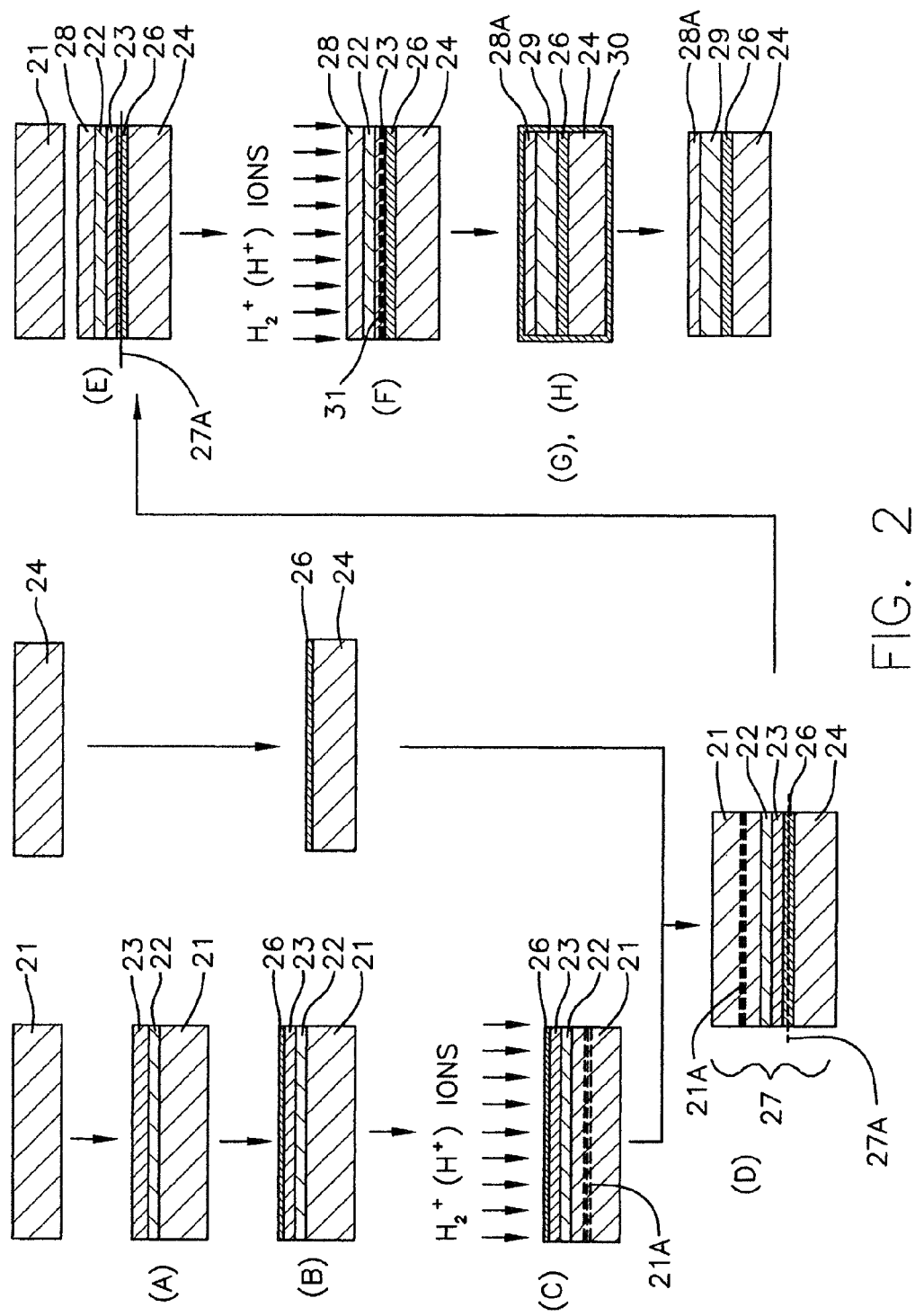
FIG. 2 is a process chart illustrating a method for manufacturing a semiconductor wafer according to a second embodiment of the present invention.

As shown in FIG. 2, a silicon wafer 21 and a support wafer 24 are prepared. Here, the silicon wafer 21 and the support wafer 24 can be of the same types as the silicon wafer 11 and the support wafer 14 as described in the first embodiment. First, an SiGe mixed crystal layer 22 and a first Si layer 23 are formed in this order on the surface of the silicon wafer 21 (step (A)). Subsequently, an $SiO_2$ layer 26 is formed on top of the first Si layer 23 and/or the support wafer 24 (step (B)). Steps (A) and (B) can be performed in the same manner as steps (a) and (b) as described in the first embodiment.

Next, hydrogen or rare gas ions are implanted, such that ionic concentration in the silicon wafer 21 peaks at 0.3 to 1.0 μm below the surface of the first Si layer 23, thereby forming a damaged layer 21a at an ion implantation position within the silicon wafer 21 (step (C)). The position at which to form the damaged layer 21a is determined by the energy applied in ion implantation. In addition, in order to separate the silicon wafer 21 at the position of the formed damaged layer 21a in a subsequent separation step, the implantation dose is required to exceed $1\times10^{16}$ atoms/cm$^2$.

Next, the silicon wafer 21 and the support wafer 24 are stacked with the SiO$_2$ layer 26 being placed therebetween to form a layered product 27 (step (D)). In step (D), the silicon wafer 21 and the support wafer 24 are stacked with the SiO$_2$ layer 26 being placed therebetween at room temperature and thereby bonded together. Subsequently, the silicon wafer 21 is separated at the position of the damaged layer 21a to form a second Si layer 28 (step (E)). In step (E), the layered product 27 is subjected to heat treatment at 500° C. or higher, so that the separation is promoted at the position of the damaged layer 21a. The separation heat treatment is preferably carried out by maintaining the layered product 27 in a nitrogen atmosphere at 500° C. for 30 minutes. After the separation, the second Si layer 28 has a mirror surface, but the surface is slightly rough, and therefore it is preferable to perform a planarization process on the surface. Examples of the planarization process include: touch polishing, in which the thickness to be polished is extremely thin; planarization through heat treatment in an argon or hydrogen gas atmosphere; and planarization through a combination of both. In the planarization through heat treatment, where a conventional resistance heating-type heat treatment furnace is used, the heat treatment is preferably carried out at 1000 to 1300° C. for approximately 0.5 to 5 hours, while in the case of using a rapid thermal annealing (RTA) device, the heat treatment is preferably carried out at 1100 to 1350° C. for approximately 1 to 120 seconds. Note that these heat treatments can be combined to carry out the planarization process. The heat treatment preferably enhances the bonding strength of the layered product 27. The heat treatment is carried out, for example, by maintaining the layered product 27 in an argon gas atmosphere at 1100° C. for 120 minutes, thereby enhancing the bonding strength at a bonding position 27a.

Next, hydrogen ion and/or rare gas ions are/is implanted such that ionic concentration peaks in an area 31 including both the interface between the first Si layer 23 and the SiO$_2$ layer 26 and the first Si layer 23 in a vicinity of the interface; (step (F)). As a result of the ion implantation to the area 31, hydrogen or rare gas ions implanted by first and second heat treatments carried out in subsequent steps reduce the binding power between the first Si layer 23 and the SiO$_2$ layer 26 during the heat treatments, allowing the SiGe mixed crystal layer 22 to be readily strain-relaxed. Consequently, the second Si layer 28 remaining in a predetermined thickness is lattice-matched to a strain-relaxed SiGe diffusion layer 29 to form a strained Si layer 28a. The term "the first Si layer 23 in a vicinity of the interface" may refer the first Si layer 23 from the interface up to half thickness of the layer 23, preferably one-fourth thickness of the layer 23. Examples of the rare gas to be implanted include helium and neon. It is particularly preferable to implant hydrogen ions. In the case of implanting hydrogen ions, the ions are implanted preferably at a dose of 3 to $50\times10^{15}$ atoms/cm$^2$, particularly preferably at a dose of $10\times10^{15}$ atoms/cm$^2$. Ge in the SiGe mixed crystal layer 22 is not allowed to be readily mobile when the implantation dose is less than $3\times10^{15}$ atoms/cm$^2$, while the effect does not vary even when the implantation dose exceeds $50\times10^{15}$ atoms/cm$^2$.

Next, the first heat treatment is carried out by maintaining the layered product 27 in an inert gas atmosphere containing nitrogen or Ar gas at 450 to 600° C. for 15 to 600 minutes (step (G)). In the first heat treatment, the layered product 27 is maintained particularly preferably at 500° C. for 30 minutes. Furthermore, following the first heat treatment, the second heat treatment is carried out by maintaining the layered product 27 at 800 to 1000° C. for 15 to 300 minutes, thereby relaxing the SiGe mixed crystal layer 22 as well as diffusing Ge through portions of the first Si layer 23 and second Si layer 28 (step (H)). In the second heat treatment, the layered product 27 is maintained particularly preferably at 850° C. for 120 minutes. By carrying out the first and second heat treatments, the SiGe mixed crystal layer 22 is relaxed, and Ge is diffused through the portions of the first Si layer 23 and second Si layer 28, thereby forming the SiGe diffusion layer 29. The second Si layer 28 is tensed to accord with the lattice constant of the SiGe diffusion layer 29 and thereby induce strain to become the strained Si layer 28a.

In addition, after the second heat treatment, a third heat treatment may be carried out to maintain the layered product 27 in an oxidizing atmosphere at 1100 to 1300° C. for 1 to 600 minutes (step (I)). The third heat treatment thins the second Si layer 28 transformed into the strained Si layer 28a, or changes the second Si layer 28 transformed into the strained Si layer 28a into an oxidized film, thereby making it possible to increase the concentration of Ge in the SiGe diffusion layer 29 that has been diffused in step (H). Note that at the time of completion of the second heat treatment in step (H), if the strained Si layer 28a has a thickness required for the strained Si layer, and the SiGe diffusion layer 29 retains a requisite Ge concentration, the third heat treatment can be omitted. Lastly, an oxidized film 30 formed on the surfaces of the layered product 27 is removed to expose the surfaces, thereby obtaining a semiconductor wafer having the strained Si layer. Depending on the Ge concentration of the SiGe diffusion layer 29, the thickness of the strained Si layer 28a is preferably 5 to 30 nm.

While the first and second heat treatment steps are performed so as to form the strained Si layer 28a from the second Si layer 28, these steps may be carried out so as not to form the strained Si layer by oxidizing the surface of the second Si layer 28 and diffusing Ge in the SiGe mixed crystal layer 22. In such a case, the oxidized film 30 is removed after the heat treatment steps, and Si is deposited on the exposed SiGe diffusion layer 29 through epitaxy, thereby obtaining a semiconductor wafer with the strained Si layer 28a. As such, by carrying out steps (A) to (H), it is possible to manufacture a semiconductor wafer with a strained Si layer having sufficient tensile strain and few crystal defects within the range of approximately $1\times10^2$ to $1\times10^3$ defects/cm$^2$, while achieving a relatively simple layered structure.

EXAMPLE

Examples of the present invention will be described in detail.

Example 1

First, as a silicon wafer and a support wafer, p-type silicon wafers, each having a diameter of 200 mm, a crystalline orientation of (100), and a resistivity of 10 Ωcm, were prepared. An SiGe mixed crystal layer and a first Si layer were formed in this order on the surface of the silicon wafer. An RT-CVD device was used to form the SiGe mixed crystal layer and the first Si layer, GeH$_4$ and SiH$_4$ were used as source gasses, the growth temperature was 650° C., the amount of source gas to be supplied was controlled such that the SiGe composition was Si$_{0.8}$Ge$_{0.2}$, and the SiGe mixed crystal layer and the first Si layer were grown to thicknesses of 100 nm and 20 nm, respectively. An SiO$_2$ layer was formed on top of the support wafer. The SiO$_2$ layer was formed by a thermal oxidation method. Oxidation conditions were to carry out pyrogenic oxidation (hydrogen combustion oxidation) at 950° C. to form the $SiO_2$ layer to a thickness of 100 nm. Then, the silicon wafer and the support wafer were stacked with the $SiO_2$ layer being placed therebetween to form a layered product. The silicon wafer and the support wafer were stacked at room temperature and tightly bonded together, and furthermore, bonding heat treatment was carried out to maintain the layered product in a non-oxidizing atmosphere at 1000° C. for 30 minutes, thereby enhancing the bonding strength at a bonding position.

Next, the silicon wafer of the layered product was thinned to form a second Si layer. The thinning process was composed of surface grinding, etching, surface polishing and vapor-phase etching. During the surface grinding, the silicon wafer was ground to a thickness of about 15 μm to form the second Si layer. Also, during the etching, the surface of the second Si layer obtained by the surface grinding was etched by about 1 μm to render the second Si layer to a thickness of about 14 μm. Also, during the surface polishing, the etched second Si layer was polished to a thickness of 3 μm. Furthermore, during the vapor-phase etching, the polished second Si layer was etched to thin its thickness to 100 nm. Next, hydrogen ions were implanted such that ionic concentration peaked in an area including both the interface between the first Si layer and the $SiO_2$ layer and the vicinity of the first Si layer side interface. The ions were implanted at a dose of $10 \times 10^{15}$ atoms/cm². The ion-implanted layered product was subjected to a first heat treatment in an inert gas atmosphere containing nitrogen gas at 500° C. for 30 minutes, and then to a second heat treatment at 850° C. for 120 minutes, thereby relaxing the SiGe mixed crystal layer and diffusing Ge through portions of the first Si layer and second Si layer to form an SiGe diffusion layer. Furthermore, the layered product was subjected to a third heat treatment in an oxidizing atmosphere at 1200° C. for one hour. By carrying out the first to third heat treatments, the second Si layer was thinned and tensed to accord with the lattice constant of the SiGe diffusion layer and thereby induce strain to become a strained Si layer. Lastly, an oxidized film formed on the surfaces of the layered product was removed to expose the strained Si layer, i.e., the topmost surface layer, thereby obtaining a semiconductor wafer having the strained Si layer. In the obtained semiconductor wafer, the strained Si layer had a thickness of 10 nm, the SiGe diffusion layer had a thickness of 110 nm, and the SiGe diffusion layer had a Ge concentration of 18%, so that the Si layer and the SiGe layer were sufficiently strained and less defective.

Example 2

First, as a silicon wafer and a support wafer, p-type silicon wafers, each having a diameter of 200 mm, a crystalline orientation of (100), and a resistivity of 10 Ωcm, were prepared. An SiGe mixed crystal layer and a first Si layer were formed in this order on the surface of the silicon wafer. An RT-CVD device was used to form the SiGe mixed crystal layer and the first Si layer, $GeH_4$ and $SiH_4$ were used as source gasses, the growth temperature was 650° C., the amount of source gas to be supplied was controlled such that the SiGe composition was $Si_{0.9}Ge_{0.1}$, and the SiGe mixed crystal layer and the first Si layer were grown to thicknesses of 100 nm and 15 nm, respectively. An $SiO_2$ layer was formed on top of the support wafer. The $SiO_2$ layer was formed by a thermal oxidation method. Oxidation conditions were to carry out pyrogenic oxidation (hydrogen combustion oxidation) at 950° C. to form the $SiO_2$ layer to a thickness of 100 nm. Then, hydrogen ions were implanted, such that ionic concentration in the silicon wafer peaked at 1.0 μm below the surface of the first Si layer, thereby forming a damaged layer at an ion implantation position within the silicon wafer. The ions were implanted at a dose of $1 \times 10^{16}$ atoms/cm². Next, the silicon wafer and the support wafer were stacked with the $SiO_2$ layer being placed therebetween to form a layered product. The silicon wafer and the support wafer were stacked at room temperature and tightly bonded together, and heat treatment was carried out to maintain the layered product at 500° C. for 30 minutes and separate the silicon wafer at the position of the damaged layer, thereby forming a second Si layer. The thickness of the second Si layer was about 130 nm. Furthermore, bonding heat treatment was carried out to maintain the layered product in a nitrogen atmosphere at 900° C. for two hours, thereby enhancing the bonding strength at a bonding position.

Subsequently, the surface of the second Si layer was subjected to a planarization process by carrying out touch polishing to remove a thickness of about 30 nm. Next, hydrogen ions were implanted, such that ionic concentration peaked in an area including both the interface between the first Si layer and the $SiO_2$ layer and the vicinity of the first Si layer side interface. The ions were implanted at a dose of $10 \times 10^{15}$ atoms/cm². The ion-implanted layered product was subjected to a first heat treatment in an inert gas atmosphere containing nitrogen gas at 500° C. for 30 minutes, and then to a second heat treatment at 850° C. for 120 minutes, thereby relaxing the SiGe mixed crystal layer and diffusing Ge through portions of the first Si layer and second Si layer to form an SiGe diffusion layer. Furthermore, the layered product was subjected to a third heat treatment in an oxidizing atmosphere at 1200° C. for four hours. By carrying out the first to third heat treatments, the second Si layer was completely transformed into the SiGe diffusion layer and an oxidized film. The oxidized film formed on the surfaces of the layered product was removed to expose the strained SiGe diffusion layer, i.e., the topmost surface layer. Lastly, a strained Si layer was formed on the exposed SiGe diffusion layer to a thickness of 12 nm through epitaxy, thereby obtaining a semiconductor wafer with the strained Si layer. An RT-CVD device was used to form the strained Si layer, $SiH_4$ was used as a source gas, and the growth temperature was 650° C. In the obtained semiconductor wafer, the strained Si layer had a thickness of 12 nm, the SiGe diffusion layer had a thickness of 55 nm, and the SiGe diffusion layer had a Ge concentration of 19%, so that the Si layer and the SiGe layer were sufficiently strained and less defective.

What is claimed is:

1. A method for manufacturing a semiconductor wafer, comprising:
    (a) forming a SiGe mixed crystal layer and a first Si layer in this order on a surface of a silicon wafer;
    (b) forming a $SiO_2$ layer on top of the first Si layer, on a separately prepared support wafer which is prepared separately from the first Si layer, or on the first Si layer and the support wafer;
    (c) forming a layered product by stacking the silicon wafer and the support wafer with the $SiO_2$ layer being placed therebetween;
    (d) forming a second Si layer by thinning the silicon wafer of the layered product to a predetermined thickness;
    (e) implanting hydrogen ions, rare gas ions, or both hydrogen ions and rare gas ions, to form ionic concentration peaks in an area which includes an interface between the first Si layer and the $SiO_2$ layer, and also includes the first Si layer from the interface up to one half a thickness thereof;

(f) carrying out a first heat treatment by maintaining the layered product in an inert gas atmosphere containing nitrogen or Argon gas at 450 to 600° C. for 15 to 600 minutes; and (g) carrying out a second heat treatment following the first heat treatment, by maintaining the layered product at 800 to 1000° C. for 15 to 300 minutes, thereby relaxing the SiGe mixed crystal layer and diffusing Ge through portions of the first Si layer and the second Si layer.

2. The method of claim 1, further comprising (h) carrying out a third heat treatment, following the second heat treatment, by maintaining the layered product in an oxidizing atmosphere at 1100 to 1300° C. for 1 to 600 minutes.

3. The method of claim 1, wherein the support wafer is an insulating substrate selected from the group consisting of quartz, sapphire, SiC, and aluminum nitride.

4. The method of claim 1, wherein the amount of Ge in the mixed crystal layer to be formed is from 3 to 30%.

5. The method of claim 1, wherein the SiGe mixed crystal layer is formed to a thickness of 20 nm to 1 µm.

6. The method of claim 1, wherein the first Si layer is formed to a thickness of 5 to 50 nm.

7. The method of claim 1, wherein the $SiO_2$ layer is formed to a thickness of 50 to 1000 nm.

8. The method of claim 1, wherein the second Si layer is thinned to a thickness of preferably 30 to 300 nm.

9. The method of claim 1, wherein the thinning is carried out by grinding, polishing, wet etching with an acid or alkali solution, vapor-phase etching with plasma, or lapping.

10. The method of claim 1 wherein the heat treatment is carried out by maintaining the layered product in an argon gas atmosphere at 1100° C. for 120 minutes.

11. The method of claim 1, wherein the hydrogen ions, rare earth ions, or both are implanted within half the thickness of the first Si layer from the interface between the first Si layer and the $SiO_2$ layer.

12. The method of claim 1, wherein the rare earth ions are selected from the group consisting of helium ions and neon ions.

13. The method of claim 1, wherein the area of (e) also includes the first Si layer from the interface up to one fourth a thickness thereof.

14. A method for manufacturing a semiconductor wafer, comprising:

(A) forming a SiGe mixed crystal layer and a first Si layer in this order on a surface of a silicon wafer;

(B) forming an $SiO_2$ layer on top of the first Si layer, a support wafer which is prepared separately from the first Si layer, or on both the first Si layer and the support wafer;

(C) forming a damaged layer at an ion implantation position within the silicon wafer by implanting hydrogen or rare gas ions, to form ionic concentration peaks at 0.3 to 1.0 µm below a surface of the first Si layer within the silicon wafer;

(D) forming a layered product by stacking the silicon wafer and the support wafer (24) with the $SiO_2$ layer being placed therebetween;

(E) forming a second Si layer by separating the silicon wafer at a position of the damaged layer;

(F) implanting hydrogen ions, rare gas ions, or both hydrogen ions and rare gas ions, to form ionic concentration peaks in an area which includes an interface between the first Si layer and the $SiO_2$ layer, and also includes the first Si layer from the interface up to one half a thickness thereof;

(G) carrying out a first heat treatment by maintaining the layered product in an inert gas atmosphere containing nitrogen or Ar gas at 450 to 600° C. for 15 to 600 minutes; and (H) carrying out a second heat treatment, following the first heat treatment, by maintaining the layered product at 800 to 1000° C. for 15 to 300 minutes, thereby relaxing the SiGe mixed crystal layer and diffusing Ge through portions of the first Si layer and the second Si layer.

15. The method of claim 14, further comprising (I) carrying out a third heat treatment, following the second heat treatment, by maintaining the layered product in an oxidizing atmosphere at 1100 to 1300° C. for 1 to 600 minutes.

16. The method of claim 14, wherein the implantation dose exceeds $1 \times 10^{16}$ atoms/cm$^2$.

17. The method of claim 14, wherein the second Si layer is formed by subjecting silicon layer to a heat treatment of at least 500° C.

18. The method of claim 14, wherein the hydrogen ions, rare earth ions, or both are implanted within half the thickness of the first Si layer from the from the interface between the first Si layer and the $SiO_2$ layer.

19. The method of claim 14, wherein the rare gas ions are selected from the group consisting of helium ions and neon ions.

20. The method of claim 14, wherein the area of (F) also includes the first Si layer from the interface up to one fourth a thickness thereof.

* * * * *

UNITED STATES PATENT AND TRADEMARK OFFICE
CERTIFICATE OF CORRECTION

| | | |
|---|---|---|
| PATENT NO. | : 7,767,548 B2 | |
| APPLICATION NO. | : 11/840615 | |
| DATED | : August 3, 2010 | |
| INVENTOR(S) | : M. Ninomiya et al. | |

It is certified that error appears in the above-identified patent and that said Letters Patent is hereby corrected as shown below:

At column 12, line 41 (claim 18, line 3) of the printed patent, "from the" (first occurrence) should be deleted since it is a duplicate.

Signed and Sealed this
Fifteenth Day of February, 2011

David J. Kappos
*Director of the United States Patent and Trademark Office*